United States Patent
Holcombe et al.

(10) Patent No.: US 7,116,121 B1
(45) Date of Patent: Oct. 3, 2006

(54) PROBE ASSEMBLY WITH CONTROLLED IMPEDANCE SPRING PIN OR RESISTOR TIP SPRING PIN CONTACTS

(75) Inventors: Brent A. Holcombe, Colorado Springs, CO (US); Brock J. LaMeres, Colorado Springs, CO (US); Donald M. Logelin, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/261,178

(22) Filed: Oct. 27, 2005

(51) Int. Cl.
*G01R 31/02* (2006.01)
(52) U.S. Cl. .................... 324/754; 324/757
(58) Field of Classification Search ............ None
See application file for complete search history.

(56) References Cited

U.S. PATENT DOCUMENTS

| | | | | |
|---|---|---|---|---|
| 4,734,046 A | * | 3/1988 | McAllister et al. | 439/101 |
| 5,416,429 A | * | 5/1995 | McQuade et al. | 324/762 |
| 5,589,781 A | * | 12/1996 | Higgins et al. | 324/755 |
| 6,242,930 B1 | * | 6/2001 | Matsunaga et al. | 324/754 |
| 6,426,637 B1 | * | 7/2002 | Dang et al. | 324/754 |

* cited by examiner

*Primary Examiner*—Paresh Patel
*Assistant Examiner*—Roberto Velez
(74) *Attorney, Agent, or Firm*—Edward L. Miller

(57) ABSTRACT

Uncontrolled characteristic impedance along a spring biased pin probe assembly is avoided by providing a stepped shelf of ground plane that extends outward along the pin and toward the target signal. The length of outward extension is chosen such that even when there is only (or at least) an expected minimum amount of compression of the spring while producing and maintaining contact, the entire exposed portion of the pin is over the shelf, whose depth of step has been selected to produce a selected $Z_0$ for the exposed pin that matches $Z_0$ for existing transmission lines already within the probe assembly. The spring biased pin may be a resistor tip spring pin that includes a small resistor in its tip.

15 Claims, 8 Drawing Sheets

PROBE ASSEMBLY WITH CONTROLLED IMPEDANCE SPRING PIN OR RESISTOR TIP SPRING PIN CONTACTS

REFERENCE TO RELATED APPLICATION

The subject matter of the present Application is related to a manner of using a spring pin contact, having a resistor in its tip for the probing of electrical signals. That spring pin resistor tip contact is shown and described in the pending US Patent Application entitled SIGNAL PROBE AND PROBE ASSEMBLY bearing Ser. NO. 11/141,500, which was filed on 31 May 2005 by Joseph Groshong, Brock J. LaMeres and Brent A. Holcombe, and which is assigned to Agilent Technologies, Inc. For the sake of completeness and for brevity, the Application 'SIGNAL PROBE AND PROBE ASSEMBLY' is hereby incorporated herein by reference.

BACKGROUND OF THE INVENTION

The probing of high frequency signals, whether for an Oscilloscope or a Logic Analyzer, presents certain technical problems that increase in difficulty as the frequency of the signal gets higher. Quite aside from attaining the requisite bandwidth in the 'Scope or Logic Analyzer, careful attention has to be paid to the way the signals of interest (the 'target signals') are acquired through suitable probes. At the highest frequencies, say, above ten GHz for 'Scopes and above about a one GHz clock rate for Logic Analyzers, probe related issues that could be often be ignored at lower frequencies emerge as factors that limit overall system performance.

The incorporated 'SIGNAL PROBE AND PROBE ASSEMBLY' is a way to deal with at least one of these issues: getting a necessary resistor in the probe's tip as close as possible to the target signal. Probes for different kinds of test equipment (e.g., 'Scopes, Logic Analyzers, Spectrum Analyzers, etc.) have such tip resistors for different reasons, such as damping, minimizing loading, attenuation, or, perhaps impedance matching. What follows the probe tip is generally a length of coaxial cable having a particular characteristic impedance ($Z_0$) that should not be thought of as merely a shielded conductor, but as a transmission line. Generally there is an active circuit of some sort at the other end of the coax, such as an amplifier with a particular frequency response, or, a threshold detector. The active circuit's output is then sent by a robust buffer amplifier over suitable transmission lines to the particular measurement circuitry in use. Probe architectures vary, but in each case it remains desirable to get the tip resistor as close as possible to the target signal.

There are two general reasons for this. First, any extra distance represents length along a conductor that will exhibit both a parasitic series inductance and a parasitic shunt capacitance to any nearby AC ground. These parasitic reactances represent target signal loading over an above what the probe's coupling network proper is intended to present. These parasitic reactances can be the cause of reflections and bandwidth limitations. Second, even if those parasitic reactances do not noticeably cause reflections and reduced bandwidth, they still amount to an unwanted intervening impedance that means that the signal presented to the entrance of the probe tip's resistor is not the identically same as the one contacted by the very end of the probe's tip. This is an issue of signal fidelity within the probe, quite apart from, and even in the absence of, significant loading.

The spring pin disclosed in 'SIGNAL PROBE AND PROBE ASSEMBLY' reduces the length of the probe tip by placing the probe tip resistor very close to the mechanical location of electrical contact with the target signal. It is almost as if one end of that resistor were the actual mechanical point of contact. We can't really achieve exactly that, because the resistor is an SMT part with rather flat surfaces for leads, while the contacting surface for the probe needs be a durable needle point or some non-slip variation on that, such as a 'crown point' having a plurality of points around a central depression. The next best thing is for the target side of the tip resistor to carry the durable point, while the other end of the resistor is mounted in a socket that in turn is carried by the larger contact structure and is mechanically biased against axial movement by a spring. 'SIGNAL PROBE AND PROBE ASSEMBLY' goes on to show an inline array of such spring pins carried by a PCB (Printed Circuit Board) that couples each of those spring pins to an associated coaxial cable that is a transmission line of characteristic impedance $Z_0$ and that leads to some type of test equipment. We shall hereinafter call such a spring pin contact a 'resistor tip spring pin' contact.

As significant an improvement as 'SIGNAL PROBE AND PROBE ASSEMBLY' represents, there is still an aspect of its operation that can be improved. In particular, and as will become apparent when the Drawings are considered, the region of the spring pin: (a) which telescopes in and out of the housing containing the spring; and (b) which bears the socket that receives the tip resistor; (c) represents a variable length (depending upon how far down the entire probe assembly is moved to ensure good contact for all the probe tips carried by the assembly) that also has an arbitrary characteristic impedance ($Z_x$) that in general is not equal to that ($Z_0$) of the interconnecting cables. This mischief arises owing to the placement of the aforementioned housing right at the edge of the PCB (in the belief that this would maximize the variation in the amounts that different spring pins may move when contact is established). That is, the pin driven by the spring and carrying the tip resistor is sticking out into space by some unregulated amount, amounting to a transmission line of arbitrary $Z_x$. Once the pin enters the housing, however, the characteristic impedance is controlled ($Z_0$), and remains so from there on as the signal proceeds further into the probe assembly. At high frequencies, the transition from the short length of uncontrolled $Z_x$ into the controlled $Z_0$ is a discontinuity that manifests itself as reflections in the time domain and as frequency response anomalies in the frequency domain. It would be advantageous to adjust $Z_x$ to be the same as $Z_0$. What to do?

SUMMARY OF THE INVENTION

A solution to the problem of uncontrolled characteristic impedance along a spring biased pin, which may have a resistor in its tip, for a probe assembly is to provide a stepped shelf of ground plane that extends outward along the pin and toward a work circuit assembly having target signals to be probed. The length of outward extension is chosen such that even when there is only (or at least) an expected minimum amount of compression of the spring while producing and maintaining contact, the entire exposed portion of the pin is over the shelf, whose depth of step has been selected to produce $Z_0$ for that exposed portion of the pin. A pin that is compressed too far will bring the circuit side of a tip resistor close to the ground plane on the shelf, and present an unwanted shunt capacitance. However this can be forestalled by proper test fixtures that are correctly adjusted. A completely uncompressed pin (i.e., one that is unused) may have a short length of $Z_x$ that extends beyond the shelf, but this case is not of interest, as that pin is evidently not in contact with a signal.

DESCRIPTION OF A PREFERRED EMBODIMENT

Figure 1:
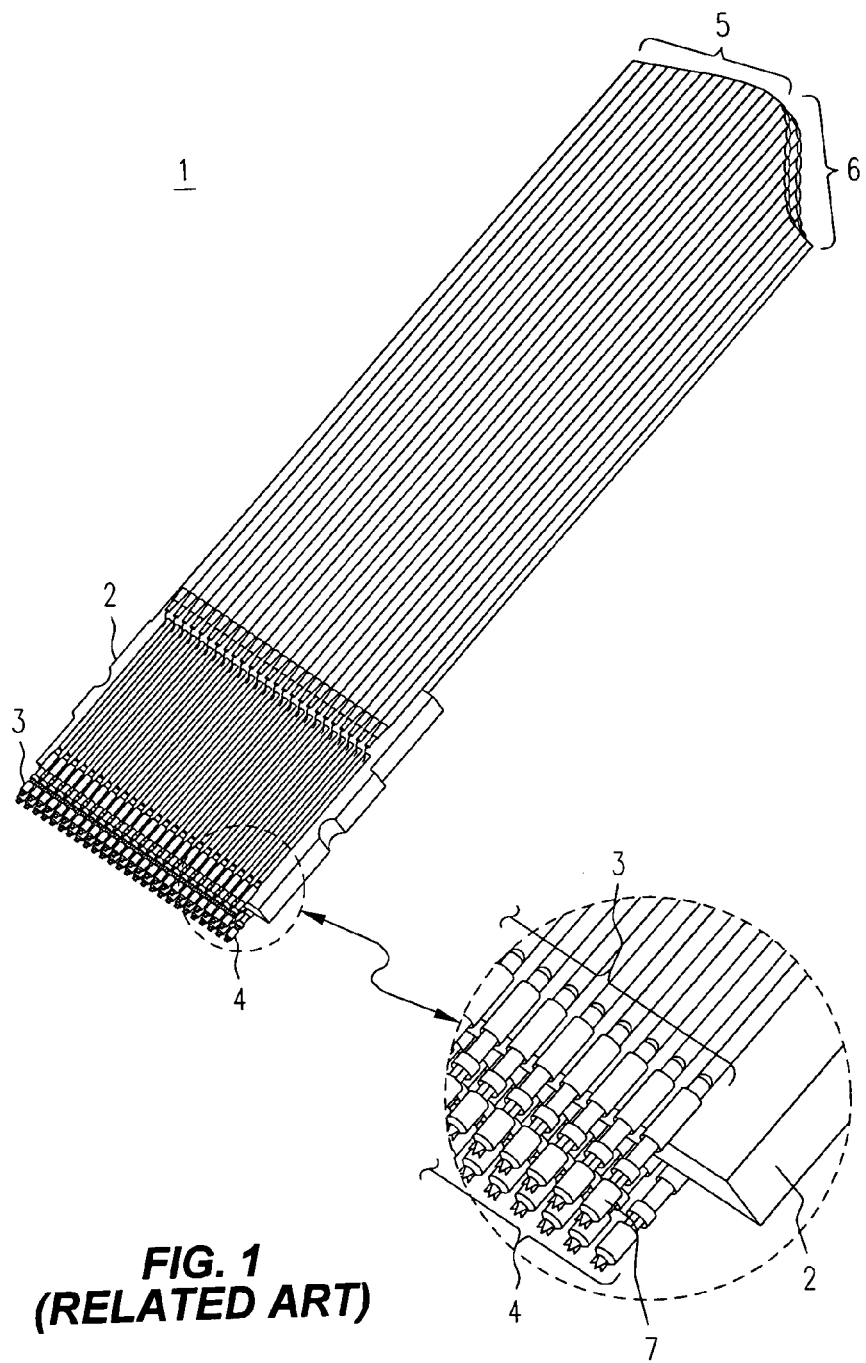
FIG. 1 is a simplified perspective view of a signal acquisition apparatus using resistor tip spring pin contacts and for which the characteristic impedance $Z_x$ of the exposed portion of the spring pins is uncontrolled.

Refer now to FIG. 1, wherein is shown a simplified representation 1 of a resistor tip spring pin probe assembly 1. Flat multiple coaxial cable assemblies 5 and 6 are connected to some item of test equipment (not shown) that might be a Logic Analyzer. Cable assembly 5 is attached to respective multiple traces on one (say, the top) surface of a printed circuit board 2; the other cable assembly is similarly attached to the other side of printed circuit board 2. As shown in the inset, a top row 3 of resistor tip spring pin contacts (7) is soldered to a far end of the traces on the top side of board 2, while a bottom row 4 of resistor tip spring pin contacts is similarly soldered to the traces on the underside of board 2. The traces to which the center conductors of the coaxial cables 5 and 6 are connected form transmission lines with ground planes within the printed circuit board 2. The outer shields of the coaxial cables 5 and 6 are, of course, connected to those ground planes. Coaxial cables 5 and 6 may be transmission lines.

Figure 2:
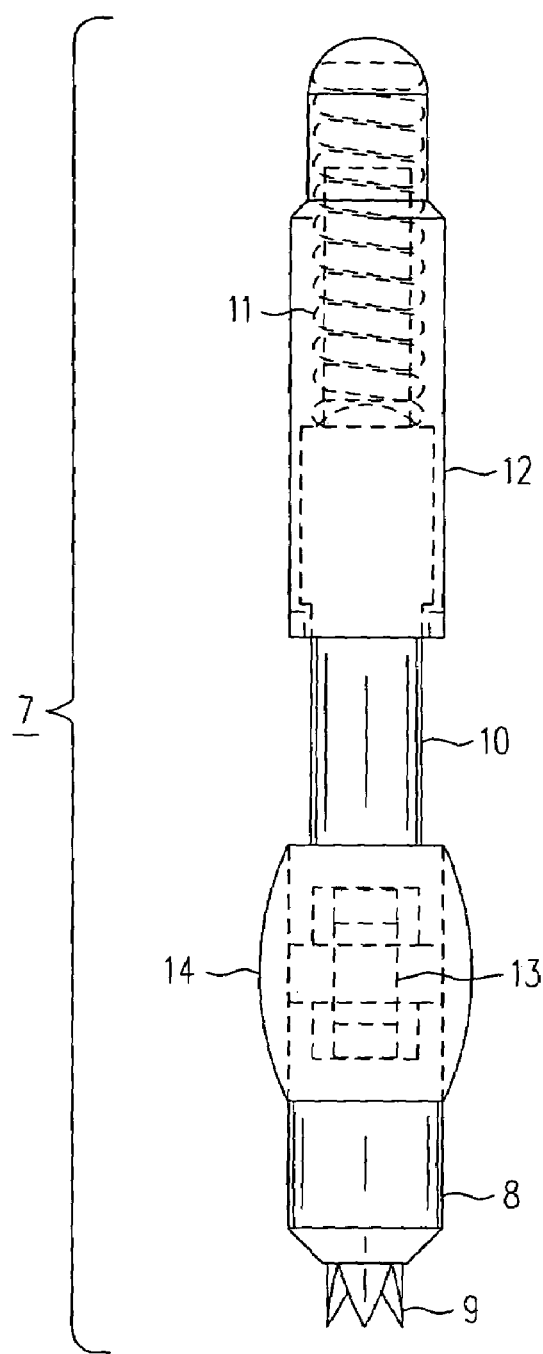
FIG. 2 is a simplified side view of the resistor tip spring pin probe assembly of FIG. 1.

Referring now to FIG. 2, it will be seen that a resistor tip spring pin contact 7 may have a crown tip 9 for ease in penetrating oxides or other coatings on surfaces to be probed. A single sharp pointed tip might be used as well; the crown tip is nearly as sharp and has the advantage of several points of electrical contact and a central concavity to help it stay put if applied against something not altogether flat.

Continuing, the crown tip 9 is seen to be the shaped end of an outer tip 8 that contains a socket for receiving one end of a resistor 13. Resistor 13 may be a common SMT (Surface Mount) resistor of the "0201" variety. The other end of resistor 13 is carried by a socket on the end of a plunger 10 which telescopes in and out of a housing 12 containing a spring 11, which may be a compression spring. Thus it is, as set out in full detail in the incorporated 'SIGNAL PROBE AND PROBE ASSEMBLY,' that the resistor 13 is as close to the point of probing as practical.

The plunger 10 is retained within housing 12, while the spring 11 provides the contact force that urges the crown tip 9 against a pad or trace (such as 16 in FIG. 3) when the resistor tip spring pin contact (7) is in use. A suitable insulating covering 14 (which may be of a suitable plastic) protects and reinforces the resistor 13 while bridging outer tip 8 and plunger 10.

Figure 3:
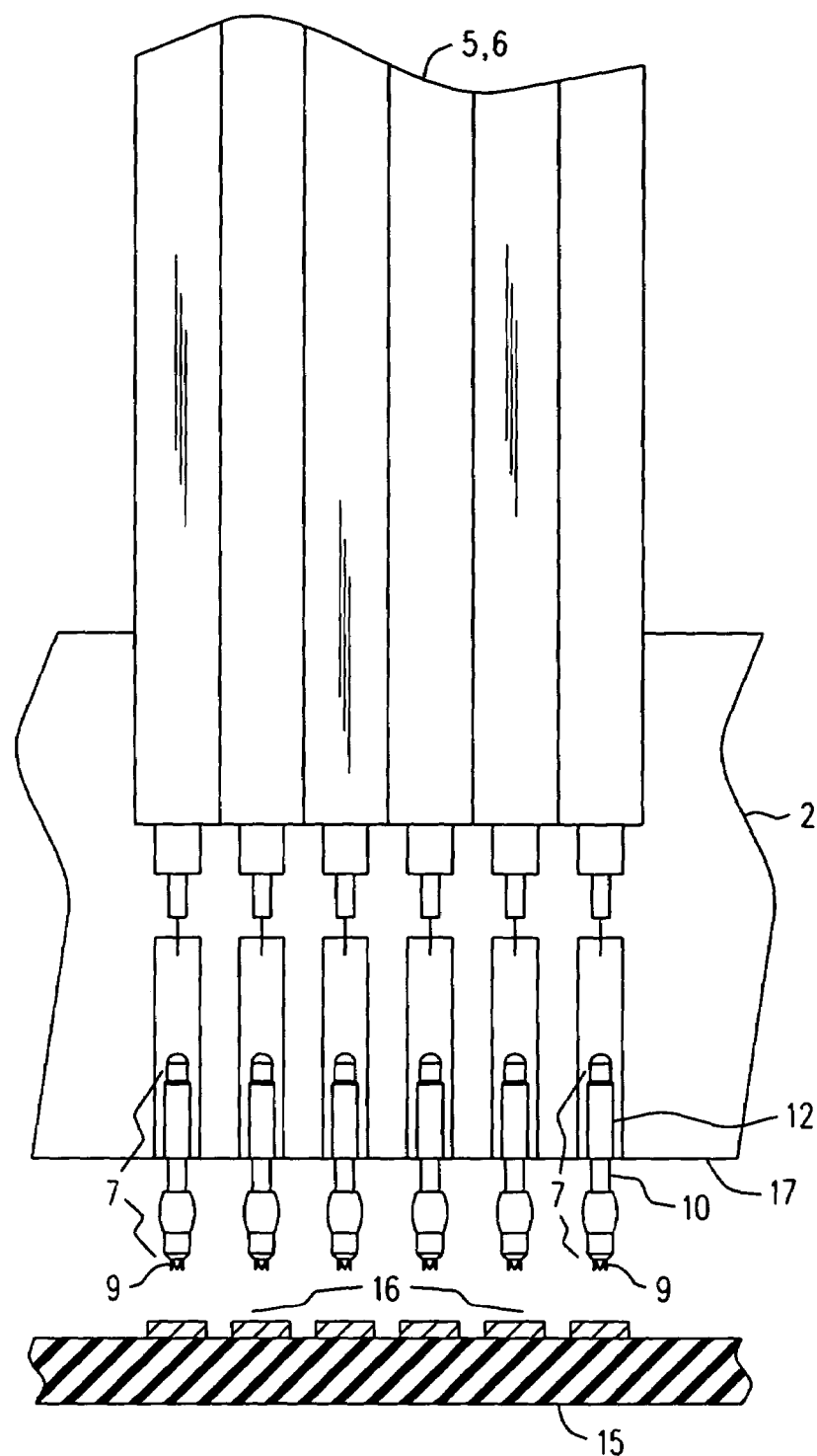
FIG. 3 is a simplified and magnified view of a portion of a resistor tip spring pin probe apparatus after the one of FIG. 1, showing certain aspects thereof when used to contact traces on a work circuit board.

Now refer to FIG. 3, and note that it shows in greater detail how the resistor tip spring pin contacts 7 are mounted to and carried by the printed circuit board 2. It will be observed that the end of the housing 12 nearest the target circuit board 15 and its pads 16 is even with the bottom edge 17 of the board 2. Target circuit board 15 bears pads or traces 16 that carry pluralities of target signals to be probed. This arrangement has certain consequences, which we now turn to in connection with FIGS. 4A–4C.

Figure 4A:
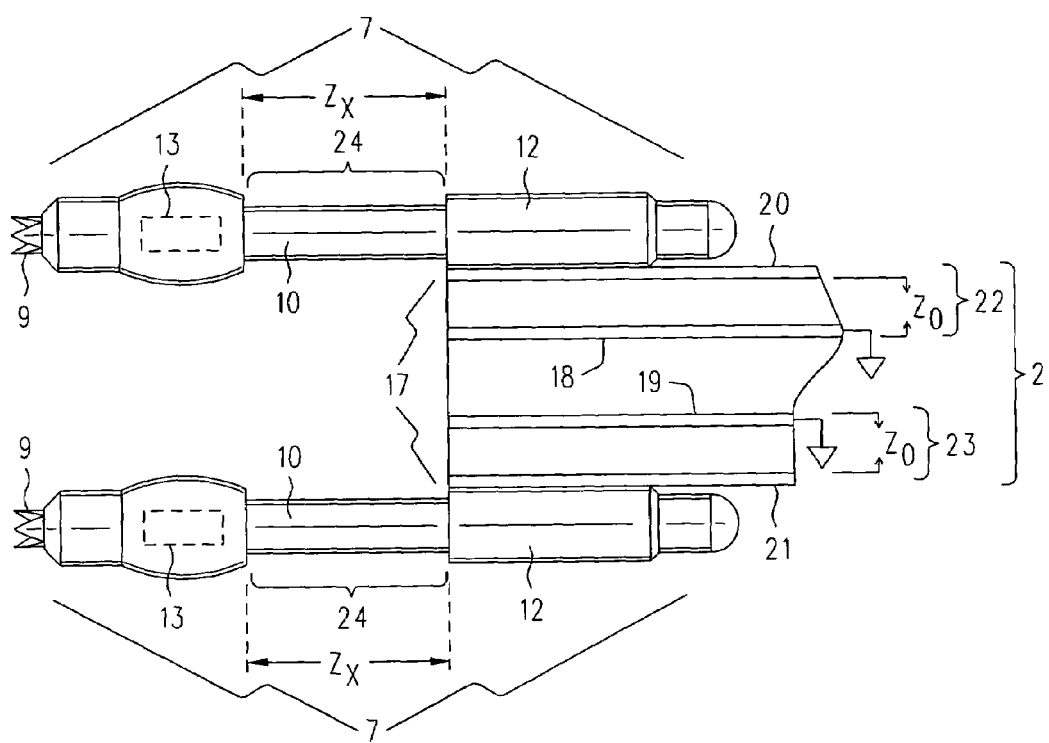
FIGS. 4A–4C are simplified side views of the uncontrolled impedance resistor tip spring pin probe assembly of FIG. 3 under varying conditions while it is in use.
Figure 4B:
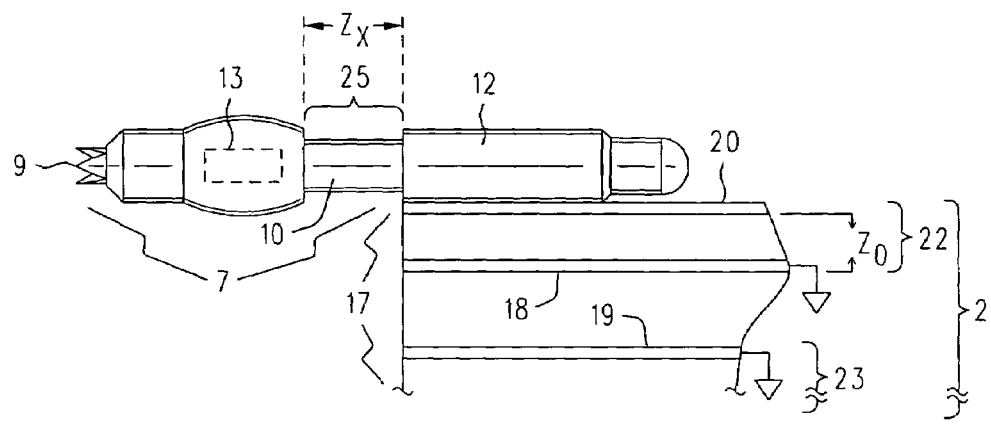
Figure 4C:
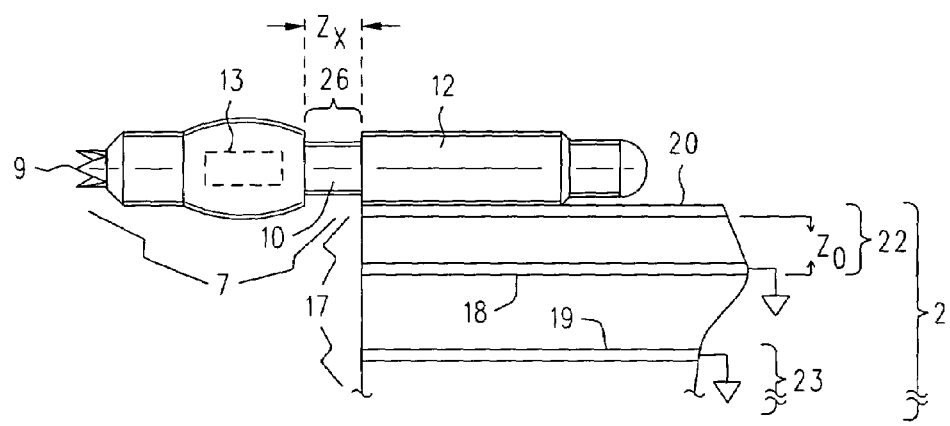

The side views in FIGS. 4A–4C show that the circuit board 2 is actually a multi-layer affair that has an associated ground plane (18, 19) underneath the conductors (20,21) to which the various resistor tip spring pin contacts 7 are soldered. The reason for this is to create strip transmission lines (22, 23) having a selected characteristic impedance $Z_0$ (e.g., 50 Ω) that matches that of the individual coaxial cables in the multiple cable assemblies 5 and 6. That is all well and good, and the mischief arises when the effects of the plunger's (10) extending outward by various amounts (24, 25, 26) are considered, especially as the signals of interest being probed increase in frequency. As can also be seen in the figures, that arrangement has the end 17 of printed circuit board 2 being a single undifferentiated surface. Thus, for each of the cases of: No contact (FIG. 4A, 24) between crown tip 9 and pad or trace 16 (refer again to FIG. 3); Contact producing fifty percent (or any other intermediate percentage of) spring compression (FIG. 4B, 25), and; (C) Contact producing maximum compression (FIG. 4C, 26), the characteristic impedance $Z_x$ associated with any of lengths 24, 25 and 26 are altogether uncontrolled. That means that the transition from any of plunger portions 24, 25 and 26 is a discontinuity when formed with the controlled characteristic impedance $Z_0$ of the housing/signal trace combination 12/20 or 12/21 and the adjacent respective ground plane 18 or 19. That discontinuity is bad news for reasons that are well understood in and of themselves.

Figure 5A:
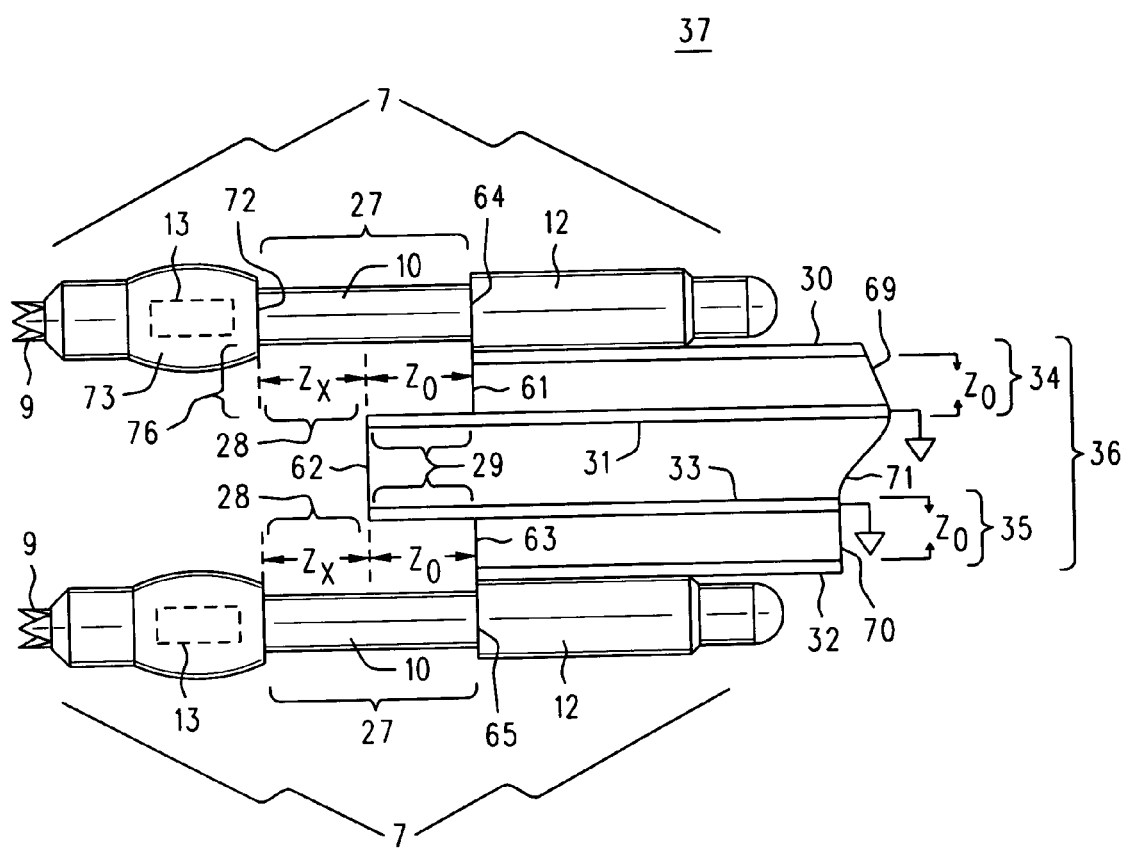
FIGS. 5A–5C are simplified side views of a controlled impedance resistor tip spring pin probe assembly under the same varying conditions of use as shown in FIGS. 4A–4C.
Figure 5B:
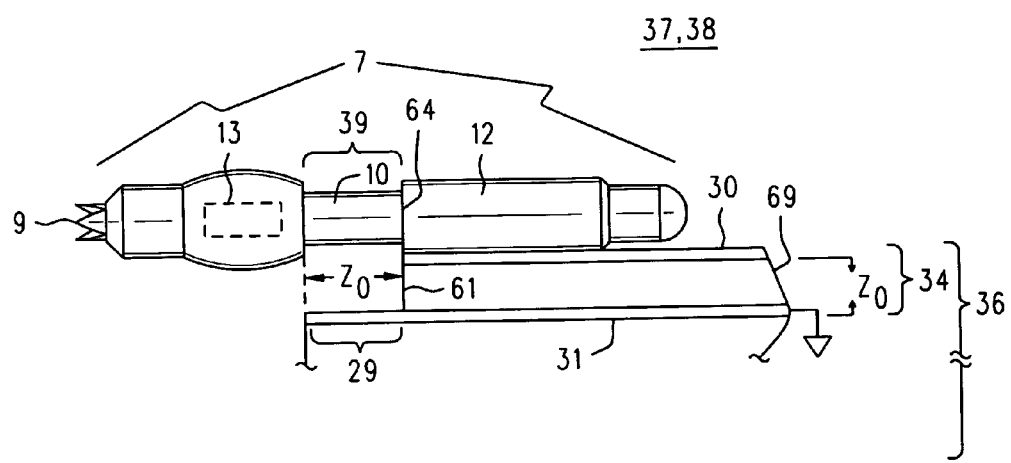
Figure 5C:
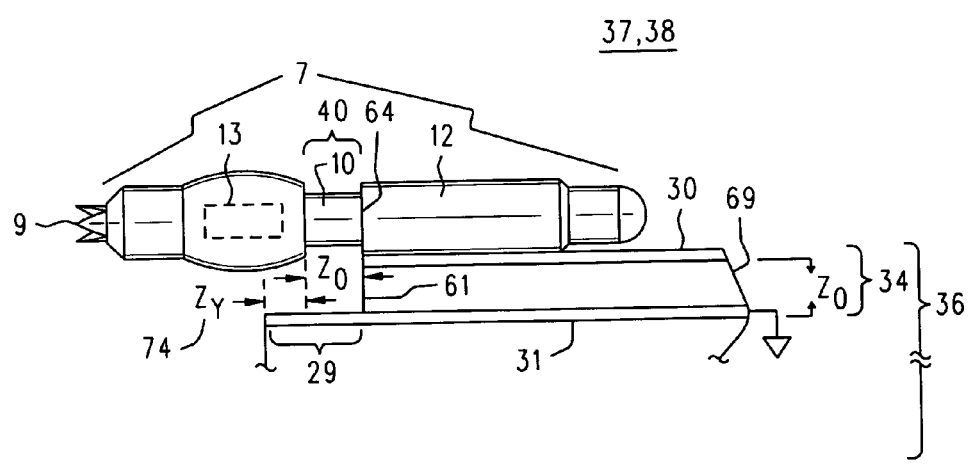

The remedy for that unfortunate situation is shown in FIGS. 5A–5C. In FIG. 5A we see a partial side view of an improved probe assembly 37 that has two rows of resistor tip spring pins 7. One row is on a first (as seen in the figure, a top) side of a multilayer printed circuit assembly 36, while the other row is on the second (bottom) side. FIG. 5A corresponds to FIG. 4A in that each depicts a case where the plunger portion 10 of the resistor tip spring pins 7 is fully extended (and thus probably not in contact with any target signals). If they are in such contact, then instances of $Z_x$ will be present, and further compression (approach of the probe assembly 37 toward the target circuits upon a work circuit assembly) is indicated. This probably amounts to adjustment of a test fixture that holds things in position relative to one another.

As in FIG. 4A, $Z_x$ will be present because most or all of the entire length 27 of the plungers 10 extend beyond the ends 64 and 65 of the housings 12, causing portions 28 to extend beyond the edge 62 of ground planes 31 and 33. Those ground planes form transmission lines 34 and 35 with the signal traces 30 and 32, to which are soldered the respective top or bottom instance of the resistor tip spring pins 7. Dielectric layer 69 separates signal trace 30 from ground plane 31, while dielectric layer 70 separates signal trace 32 from ground plane 33. The two ground planes 31 and 33 are separated by dielectric layer 71 that shares with them the end or edge 62. Dielectric layers 96, 70 and 71 may be of FR4, or other suitable substrate material. It will be appreciated that edge 62 cannot be moved (leftward in the drawing) all the way toward the work circuit assembly (not shown) having the target signals, as to do so would likely create mechanical interference with the work circuit assembly and prevent the movement of the plungers 10 into the housings 12. That, of course, would force at least some $Z_x$ to remain, which is most undesirable. Thus it is that the start of the bulge 72 for the covering 73 of the resistor 13 is at a location that will be proximate (i.e., above or below, according to which is the row of contacts) edge 62 while additional compression of plungers 10 into housings 12 is still possible. In this way a variety of different compressions will eliminate $Z_x$ and allow just a remaining $Z_0$ of some length.

Things will be arranged, then, so that when all the resistor tip spring pins 7 are in contact with their respective target signals, all of the plungers 10 will be pushed into their respective housings 12 to respective amounts so that no $Z_x$ is present for any plunger. And as will be explained shortly, the characteristic impedance $Z_0$ of the length 29 is the same $Z_0$ as of the transmission lines 34 and 35, (which may be strip lines), which is of course selected to be the same $Z_0$ for the characteristic impedance of the interconnecting coaxial cable assemblies 5 and 6.

We turn now to FIG. 5B, which is a partial side view of an arrangement 38 similar to that 37 of FIG. 5A. One difference is that length 39 is equal to the distance 29 by which the ground plane 31 extends beyond edge 61 in a direction toward the work circuit assembly and the target signals (which for brevity, neither of which is shown). The pesky $Z_x$ has vanished, leaving only $Z_0$. The plunger 10 will preferably not yet be at its maximum penetration into the housing 12. The other difference is that FIG. 5B may also be taken as representative of a situation 38 where there is but one row of pins 7 disposed upon only one side of the printed circuit assembly 36. (As if in FIG. 1 row 4 of contacts 7 and its associated cable assembly 6 were never present.)

FIG. 5C shows a partial side view very much like the one of FIG. 5B, save that now length 40 is less than distance 29. As before, the original $Z_x$ is gone, leaving a region of length 40 of $Z_0$, and some new region 74 of length that is approximately length 29 diminished by length 40 (for brevity we are neglecting fringe effects) and whose characteristic impedance is some unknown $Z_y$. We can do two things to mitigate the possibility that $Z_y$ will re-introduce the mischief of $Z_x$ that we have worked to hard to eliminate. First, it might be that $Z_y$ is sufficiently close to $Z_0$ (say, within ten percent) that we needn't be concerned, or, that if it is not then we can make it so. A particular dielectric constant for the covering of the resistor 13 might help in this. Second, we can adjust the fixtures in use (not shown) so that the situation of FIG. 5C does not, or seldom, occurs, and that if it does, then the length 74 is sufficiently small that $Z_y$ may simply be ignored. If length 74 is sufficiently small then the frequencies needed to 'see' it as a significant quantity may well be higher than either or both of the upper frequencies produced by the SUT or the test equipment in use.

The fabrication of strip and coplanar transmission lines on printed substrates is a conventional technique that is generally well understood. It involves the relation $$Z_0 = \sqrt{(L/C)}$$

where amounts of distributed inductance and capacitance per unit of length. Properties that go into selecting the dimensions of such transmission lines are the size of the conductors, their distance apart and the dielectric constant that separates them. It is a routine matter to select the parameters that determine the $Z_0$ of the transmission lines 34 and 35, all the way up to edges 61 and 63, respectively. The presence of pins 7 soldered to signal traces 30 or 32 has only a minor effect on the characteristic impedance as a signal leaves the plunger 10 and enters the housing/signal trace combination. Of greater interest is how region 29 can be adjusted to have the same $Z_0$ as do the transmission lines 34 and 35.

What we need to do is keep the same ratio of L and C for the region 29 as for the transmission lines 34 and 35. We shall follow the usual convention of understanding the distributed reactive properties of a transmission line as is they were a very large number of suitable small but adjoining lumped constants. In the following discussion, statements about increasing or decreasing the values of C and L should be understood as values per unit of length. C (per unit length) is influenced by both distance and dielectric constant. C is inversely proportional to distance, which goes up some, tending to decrease C in region 29. C is proportional to the dielectric constant separating the elements of the capacitance. The air dielectric of region 29 will be one, while that of FR4, for example, is usually taken to be four. Both of these relationships will tend to decrease C (per unit length) in region 29, since the separation distance increases and the dielectric constant will likely drop, or at best, stay the same. C is also affected by the effective area of the plates, which is to say, by width per unit length; it is proportional to that effective area (width). L (in this case, self-inductance per unit length) will increase as the diameter decreases (increases proportionally to the reciprocal of the diameter). What we have to work with, then, is an increase or decrease in the diameter of the plunger 10 (varies L), the change in width (effective plate area to the ground plane 31 or 33) as the diameter of the plunger 10 changes compared to the (previous) width of the signal traces 30 and 32, and the distance, or height, of plunger 10 above or away from the extended shelf 29 of the ground planes 31 and 33 (varies C). It will be appreciated that the length of a transmission does not affect its value for $Z_0$.

For example, a height 76 of 0.0075" for stepped region 29 with a thickness of 0.0020" of FR4 for intervening dielectrics 69 and 70 will produce a $Z_0=50\ \Omega$ for a signal trace width of 0.003" and a plunger diameter of 0.0130". A height 76 of 0.0020" for stepped region 29 with a thickness of 0.0085" of FR4 for intervening dielectrics 69 and 70 will produce a $Z_0=75\ \Omega$ for a signal trace width of 0.0165" and a plunger diameter of 0.0130".

Figure 6A:
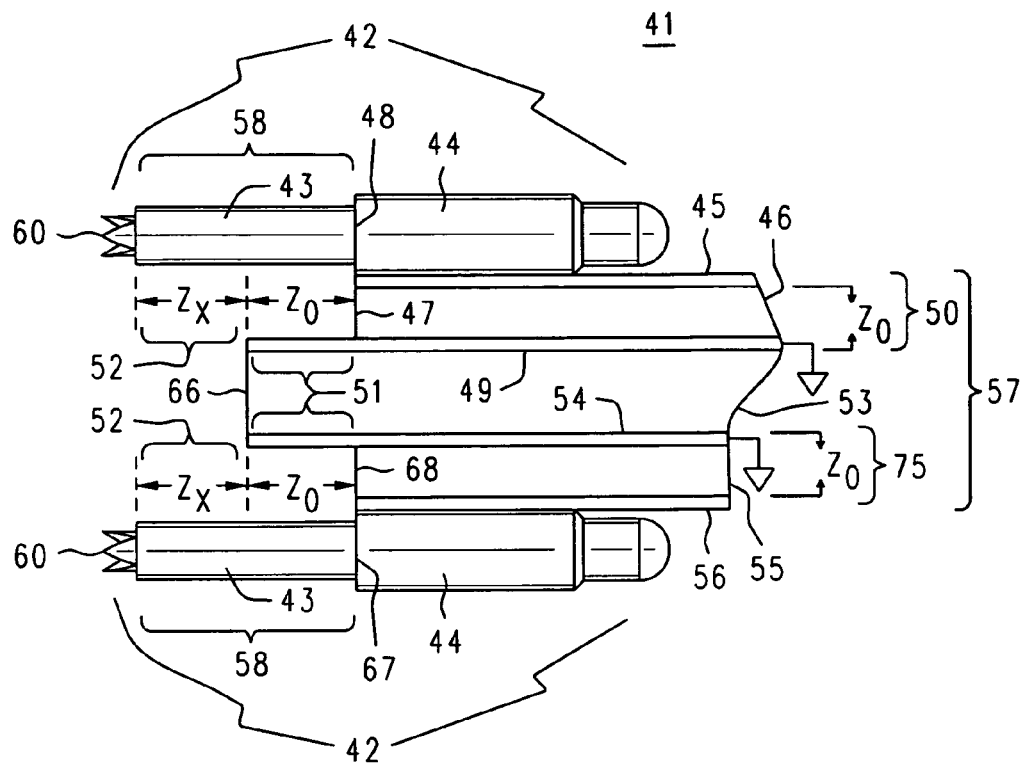
FIGS. 6A–B are simplified side views of a controlled impedance non-resistor-tip spring pin probe assembly under varying conditions.
Figure 6B:
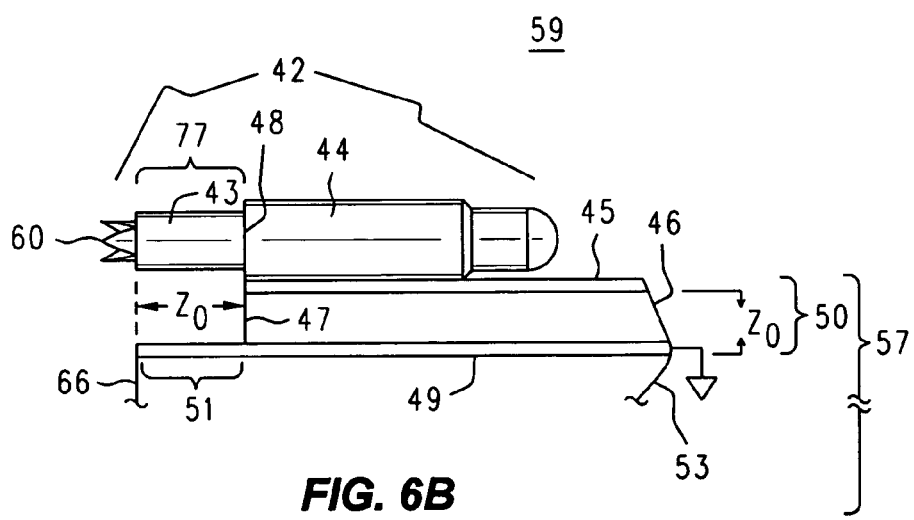

Finally, the reader is referred to FIGS. 6A and 6B. These views 41 and 59 depict probe assemblies having spring pins 42 without resistors in their tips. View 41 of FIG. 6A otherwise corresponds to FIG. 5A, while view 59 of FIG. 6B otherwise corresponds to FIG. 5B, especially in the notion that there may be one (FIG. 6B, 59) or two (FIG. 6A, 41) rows of spring pins 42.

In these figures the spring pins 42 have plungers 43 the carry crown tips 60, or perhaps some other form of pointed tip. Housings 44 carry the plungers in the same way as before (see FIG. 2), and are soldered to signal traces 45 and 56, which in turn cooperate with intervening dielectric layers 46 and 55 to produce from ground planes 49 and 54 transmission lines 50 and 75, respectively. These transmission lines have $Z_0$ as their characteristic impedance, which will match that of the interconnecting flexible coaxial cables (e.g., 5 and 6 of FIG. 1, but which are not shown in FIGS. 6A–B). The edges 48/67 of the housings 44 from which plungers 43 emerge is aligned with the ends 47/68 of the signal trace/dielectric layer combinations 45/46 and 56/55. These alignments are one terminus of a region 51 of characteristic impedance $Z_0$ the exists between the end 47, along the amount 51 that the ground plane (45, 54) extends beyond end 47 and beneath the emerging plunger 43 until the other terminus at end 66. In the event that there are to be two rows of spring pins 42 there will also be an intervening dielectric layer 53 to separate the two ground planes 49 and 54. The result is a multilayer printed circuit assembly 57.

Corresponding to the explanation of FIG. 5A, in FIG. 6A a $Z_x$ of length 52 is formed as the plunger 43 extends beyond the edge 66 of the ground plane 49.

Corresponding to the explanation of FIG. 5B, in FIG. 6B $Z_x$ is absent, leaving only a $Z_0$ of length 51.

We claim:

1. In a probe assembly for probing a target signal upon a work circuit assembly with a spring pin contact which is electrically connected to a transmission line formed upon and carried by a printed circuit assembly that when urged against the work circuit assembly compresses the spring pin contact into electrical contact with the target signal, the improvement comprising:
   the transmission line being formed by a signal trace separated from a ground plane by the thickness of an intervening dielectric layer;
   the intervening dielectric layer having a first edge parallel to a plane formed by the work circuit assembly;
   the ground plane having an extended portion that extends beyond the first edge of the intervening dielectric layer in a direction toward the work circuit assembly by a selected first distance bounded by a second edge;
   a housing portion of the spring pin contact being in electrical contact with the signal trace of the transmission line and also having an end proximate with the first edge of the intervening dielectric layer;
   a plunger portion of the spring pin contact extending out of a housing portion, over the extended portion of the ground plane and beyond the second edge by a selected second distance; and
   wherein the characteristic impedance of a transmission line formed by the plunger portion and the extended portion of the ground plane is approximately the same as the characteristic impedance of the transmission line formed by the signal trace and the ground plane.

2. A probe assembly as in claim 1 wherein the intervening dielectric layer is of FR4 and the characteristic impedance of the transmission line is approximately 50 Ω.

3. A probe assembly as in claim 1 wherein the intervening dielectric layer is of FR4 and the characteristic impedance of the transmission line is approximately 75 Ω.

4. A probe assembly as in claim 1 wherein a flexible transmission line is connected at one end thereof to the transmission line formed on and carried by the work circuit assembly and also at another end thereof to an item of electronic test equipment.

5. A probe assembly as in claim 1 wherein the spring pin further comprises a resistor carried by the plunger portion and thereby is a resistor tip spring pin.

6. In a probe assembly for probing a plurality of target signals upon a work circuit assembly with a respectively plurality of spring pin contacts electrically connected to a corresponding member of a respective plurality of transmission lines formed upon and carried by a printed circuit assembly that when urged against the work circuit assembly compresses each spring pin contact into electrical contact with a respective target signal in the plurality thereof, the improvement comprising:
   the plurality of spring pin contacts being arranged in a row;
   the plurality of transmission lines being formed by respective signal traces separated from a ground plane by the thickness of an intervening dielectric layer;
   the intervening dielectric layer having a first edge parallel to a plane formed by the work circuit assembly;
   the ground plane having an extended portion that extends beyond the first edge of the intervening dielectric layer in a direction toward the work circuit assembly by a selected first distance bounded by a second edge;
   a housing portion of each spring pin contact being in electrical contact with the signal trace of its associated transmission line and also having an end proximate the first edge of the intervening dielectric layer;
   a plunger portion of each spring pin contact extending out of a respective housing portion, over the extended portion of the ground plane and beyond the second edge by a selected second distance; and
   wherein the characteristic impedance of a transmission line respectively formed by each plunger portion and the extended portion of the ground plane is approximately the same as the characteristic impedance of each respective transmission line formed by each signal trace and the ground plane.

7. A probe assembly as in claim 6 wherein the intervening dielectric layer is of FR4 and the characteristic impedance of the transmission line is approximately 50 Ω.

8. A probe assembly as in claim 6 wherein the intervening dielectric layer is of FR4 and the characteristic impedance of the transmission line is approximately 75 Ω.

9. A probe assembly as in claim 6 wherein a plurality of flexible transmission lines are respectively connected at one end thereof to the plurality of transmission lines formed on and carried by the work circuit assembly and also at another end thereof to respective channels in an item of electronic test equipment.

10. In a probe assembly for probing first and second pluralities of target signals upon a work circuit assembly with respective first and second pluralities of spring pin contacts electrically connected to a corresponding members of respective first and second pluralities of transmission lines formed upon and carried by respective first and second sides of a printed circuit assembly that when urged against the work circuit assembly compresses each spring pin contact into electrical contact with a respective target signal in the respective pluralities thereof, the improvement comprising:
   the first plurality of spring pin contacts being arranged in a first row disposed on the first side of the printed circuit assembly;
   the first plurality of transmission lines being formed by respective first signal traces separated from a first ground plane by the thickness of a first intervening dielectric layer;
   the first intervening dielectric layer having a first edge parallel to a plane formed by the work circuit assembly;
   the first ground plane having an extended portion that extends beyond the first edge of the first intervening dielectric layer in a direction toward the work circuit assembly by a selected first distance bounded by a second edge;

a housing portion of each spring pin contact in the first plurality thereof being in electrical contact with the first signal trace of its respective transmission line in the first plurality thereof and also having an end proximate the first edge of the first intervening dielectric layer;

a plunger portion of each spring pin contact in the first plurality thereof extending out of a respective housing portion, over the extended portion of the first ground plane and beyond the second edge by a selected second distance;

wherein the characteristic impedance of a transmission line respectively formed by each plunger portion extending over the extended portion of the first ground plane is approximately the same as the characteristic impedance of each respective transmission line in the first plurality thereof formed by each first signal trace therein and the first ground plane;

the second plurality of spring pin contacts being arranged in a second row disposed on the second side of the printed circuit assembly;

the second plurality of transmission lines being formed by respective second signal traces separated from a second ground plane by the thickness of a second intervening dielectric layer;

the second intervening dielectric layer having a third edge parallel to the plane formed by the work circuit assembly;

the second ground plane having an extended portion that extends beyond the third edge of the second intervening dielectric layer in a direction toward the work circuit assembly by a selected third distance bounded by a fourth edge;

a housing portion of each spring pin contact in the second plurality thereof being in electrical contact with the second signal trace of its respective transmission line in the second plurality thereof and also having an end proximate the third edge of the second intervening dielectric layer;

a plunger portion of each spring pin contact in the second plurality thereof extending out of a respective housing portion, over the extended portion of the second ground plane and beyond the third edge by a selected fourth distance; and wherein the characteristic impedance of a transmission line respectively formed by each plunger portion extending over extended portion of the second ground plane is approximately the same as the characteristic impedance of each respective transmission line in the second plurality thereof formed by each second signal trace therein and the second ground plane.

11. In a probe assembly for probing a plurality of target signals upon a work circuit assembly with a respective plurality of resistor tip spring pin contacts, each one of which is electrically connected to a corresponding member of a respective plurality of transmission lines formed upon and carried by a printed circuit assembly that when urged against the work circuit assembly compresses each resistor tip spring pin contact into electrical contact with a respective target signal in the plurality thereof, the improvement comprising:

the plurality of resistor tip spring pin contacts being arranged in a row;

the plurality of transmission lines being formed by respective signal traces separated from a ground plane by the thickness of an intervening dielectric layer;

the intervening dielectric layer having a first edge parallel to a plane formed by the work circuit assembly;

the ground plane having an extended portion that extends beyond the first edge of the intervening dielectric layer in a direction toward the work circuit assembly by a selected first distance bounded by a second edge;

a housing portion of each resistor tip spring pin contact being in electrical contact with the signal trace of its associated transmission line and also having an end proximate the first edge of the intervening dielectric layer;

a plunger portion of each resistor tip spring pin contact extending out of a respective housing portion, over the extended portion of the ground plane and beyond the second edge by a selected second distance; and wherein the characteristic impedance of a transmission line respectively formed by each plunger portion and the extended portion of the ground plane is approximately the same as the characteristic impedance of each respective transmission line formed by each signal trace and the ground plane.

12. A probe assembly as in claim 11 wherein the intervening dielectric layer is of FR4 and the characteristic impedance of the transmission line is approximately 50 Ω.

13. A probe assembly as in claim 11 wherein the intervening dielectric layer is of FR4 and the characteristic impedance of the transmission line is approximately 75 Ω.

14. A probe assembly as in claim 11 wherein a plurality of flexible transmission lines are respectively connected at one end thereof to the plurality of transmission lines formed on and carried by the work circuit assembly and also at another end thereof to respective channels of an item of electronic test equipment.

15. In a probe assembly for probing first and second pluralities of target signals upon a work circuit assembly with respective first and second pluralities of resistor tip spring pin contacts electrically connected to a corresponding members of respective first and second pluralities of transmission lines formed upon and carried by respective first and second sides of a printed circuit assembly that when urged against the work circuit assembly compresses the resistor tip spring pin contact into electrical contact with a respective target signal in the respective pluralities thereof, the improvement comprising:

the first plurality of resistor tip spring pin contacts being arranged in a first row upon the first side of the printed circuit assembly;

the first plurality of transmission lines being formed by respective first signal traces separated from a first ground plane by the thickness of a first intervening dielectric layer;

the first intervening dielectric layer having a first edge parallel to a plane formed by the work circuit assembly;

the first ground plane having an extended portion that extends beyond the first edge of the first intervening dielectric layer in a direction toward the work circuit assembly by a selected first distance bounded by a second edge;

a housing portion of each resistor tip spring pin contact in the first plurality thereof being in electrical contact with the first signal trace of its respective transmission line in the first plurality thereof and also having an end proximate the first edge of the first intervening dielectric layer;

a plunger portion of each resistor tip spring pin contact in the first plurality thereof extending out of a respective housing portion, over the extended portion of the first ground plane and beyond the second edge by a selected second distance;

wherein the characteristic impedance of a transmission line respectively formed by each plunger portion extending over the extended portion of the first ground plane is approximately the same as the characteristic impedance of each respective transmission line in the first plurality thereof formed by each first signal trace therein and the first ground plane;

the second plurality of resistor tip spring pin contacts being arranged in a second row disposed upon the second side of the printed circuit assembly;

the second plurality of transmission lines being formed by respective second signal traces separated from a second ground plane by the thickness of a second intervening dielectric layer;

the second intervening dielectric layer having a third edge parallel to the plane formed by the work circuit assembly;

the second ground plane having an extended portion that extends beyond the third edge of the second intervening dielectric layer in a direction toward the work circuit assembly by a selected third distance bounded by a fourth edge;

a housing portion of each resistor tip spring pin contact in the second plurality thereof being in electrical contact with the second signal trace of its respective transmission line in the second plurality thereof and also having an end proximate with the third edge of the second intervening dielectric layer;

a plunger portion of each resistor tip spring pin contact in the second plurality thereof extending out of a respective housing portion, over the extended portion of the second ground plane and beyond the third edge by a selected fourth distance; and wherein the characteristic impedance of a transmission line respectively formed by each plunger portion extending over extended portion of the second ground plane is approximately the same as the characteristic impedance of each respective transmission line in the second plurality thereof formed by each second signal trace therein and the second ground plane.

* * * * *